(12) United States Patent
Lam

(10) Patent No.: US 7,733,172 B2
(45) Date of Patent: Jun. 8, 2010

(54) DC SELF-BIASED VACUUM TUBE DIFFERENTIAL AMPLIFIER WITH GRID-TO-CATHODE OVER-VOLTAGE PROTECTION

(76) Inventor: Chi Ming John Lam, Unit L, 5/F., Block 1, International Industrial Center, 2-8 Kwei Tei St., Fotan, Shatin (HK)

(*) Notice: Subject to any disclaimer, the term of this patent is extended or adjusted under 35 U.S.C. 154(b) by 0 days.

(21) Appl. No.: 12/351,884

(22) Filed: Jan. 12, 2009

(65) Prior Publication Data

US 2009/0212857 A1 Aug. 27, 2009

(30) Foreign Application Priority Data

Feb. 25, 2008 (GB) ................................. 0803381.3

(51) Int. Cl.
*H03F 3/45* (2006.01)
(52) U.S. Cl. ......................................... 330/69; 330/252
(58) Field of Classification Search .................. 330/69, 330/46, 41, 42, 43, 44, 252
See application file for complete search history.

(56) References Cited

U.S. PATENT DOCUMENTS

| 2,776,343 | A | * | 1/1957 | Yuni ............................ 330/96 |
| 3,127,569 | A | | 3/1964 | Murray | |
| 4,134,077 | A | * | 1/1979 | Kelly et al. .................... 330/69 |
| 6,111,460 | A | * | 8/2000 | Yamasita ...................... 330/69 |
| 7,304,535 | B2 | | 12/2007 | Lam | |
| 7,482,867 | B2 | * | 1/2009 | Lam ............................ 330/69 |

FOREIGN PATENT DOCUMENTS

GB 743588 A1 1/1956

* cited by examiner

*Primary Examiner*—Henry K Choe
(74) *Attorney, Agent, or Firm*—William J. Sapone; Coleman Sudol Sapone P.C.

(57) ABSTRACT

A single stage differential amplifier is disclosed as comprising a pair of vacuum tube triodes for amplifying two input signals and generating two output signals. The differential amplifier has DC self-biasing ability and grid-to-cathode over-voltage protection for directly coupling from the outputs of another differential amplifier. By possessing these unique features, this differential amplifier becomes an important building block in forming a balanced amplifier by cascading multi differential amplifiers in a directly coupled fashion.

14 Claims, 8 Drawing Sheets

DC SELF-BIASED VACUUM TUBE DIFFERENTIAL AMPLIFIER WITH GRID-TO-CATHODE OVER-VOLTAGE PROTECTION

BACKGROUND

As mentioned in U.S. Pat. No. 7,304,535, a vacuum tube balanced audio power amplifier normally contains three amplifying stages, namely an input stage, a second stage and an output stage. These are shown in FIGS. 3, 4, 5A, 5B, 6A, 6B, 9 and 10 of U.S. Pat. No. 7,304,535. Differential amplifiers of various kinds can be used to form the input and second stages. A commonly used vacuum tube differential amplifier is shown in FIG. 7 hereof. This differential amplifier can be used to form the first two stages of a conventional vacuum tube balanced audio power amplifier, as depicted in FIG. 8 hereof.

It is clear from FIG. 8 hereof that the input stage is a differential amplifier constructed by two triodes in the exact same form as shown in FIG. 7. Resistors R1 and R2 connect the grid to ground so that correct DC biasing can be set up for the tubes T1a and T1b. The outputs taken from the plates of vacuum tubes T1a, T1b are directly coupled respectively to the grids of vacuum tubes T5a, T5b of the second stage via series resistors R36 and R37. The second stage is also a differential amplifier in the exact same form. The outputs taken from the plates of the vacuum tubes T5a and T5b of the second stage are R-C coupled to the output stage via capacitors C10, C11 and resistors R25 and R26. The output stage consists of a pair of beam power tubes T3, T4 and output-matching transformer OPT.

Unlike small signal solid-state semiconductor transistors, in which the DC current gain (i.e., $h_{FE}$, or sometimes referred to as DC amplifying factor) is very close for the same type of transistors, the DC amplifying factor of small signal vacuum tubes of the same type can differ immensely. It is because the advanced technologies of solid-state semiconductor fabrication allow the parameters of transistors to be tightly controlled. However, manufacturing of vacuum tube still relies on the skills of production workers in winding and aligning the wires and metal plates.

The differences in vacuum tube DC amplifying factor make it very difficult for vacuum tube amplifying stages to be directly coupled while maintaining the correct DC biasing for subsequent stages. It is obvious that in direct coupling of amplifying stages, the mismatched DC biasing voltages created from the first stage will be passed to the subsequent stages so that an even bigger mismatch of DC biasing voltages is created. As a result, the two vacuum tubes of a differential amplifier in a subsequent stage have to face two very different DC biasing voltages. Therefore, this leads to different biasing currents, signal voltage swings, output impedances and distortion levels at the two outputs of the differential amplifier in the subsequent stage. Hence the desired balancing properties of a vacuum tube balanced audio power amplifier can no longer be maintained.

In such a scenario, a common practice is to choose well-matched vacuum tubes for direct coupling applications. However, it is sometimes impractical and time consuming to screen the tubes. Even if well-matched vacuum tubes are used, as the tubes get aged after a period of operation, the mismatch will eventually resurface as some tubes deteriorate faster than others. Therefore, tube aging again creates mismatch of DC biasing. Another conventional method is to use R-C coupling rather than direct coupling between amplifying stages. This can totally eliminate the mismatched DC biasing problem passing from previous stages as DC voltages are completely blocked by the coupling capacitors. However, it is well known that an amplifier formed by R-C coupling of amplifying stages generally has poorer low frequency response than one formed by direct coupling. Poor low frequency response is not desirable in audio application.

The aim of this invention is to provide a new differential amplifier such that the use of well-matched vacuum tubes is no longer an absolute necessity for direct coupling applications. This invention will at least reduce the DC biasing mismatch to an acceptable level for most direct coupling applications. In addition, a grid-to-cathode over-voltage protection is included.

According to the present invention, there is provided a single stage differential amplifier including a pair of vacuum tube triodes for amplifying two input signals and generating two output signals, wherein said input signals are fed to the grids of said pair of vacuum tube triodes, and a pair of two series resistors on each grid is cross-connected to two separate junctions formed by a pair of two series resistors, respectively, such that the latter pair of series resistors are connected together with a constant current source connected to a negative power supply.

BRIEF DESCRIPTION OF THE DRAWINGS

Preferred embodiments of the present invention will now be described, by way of examples only, with reference to the accompanying drawings, in which.

DETAILED DESCRIPTION OF THE INVENTION

Figure 1:
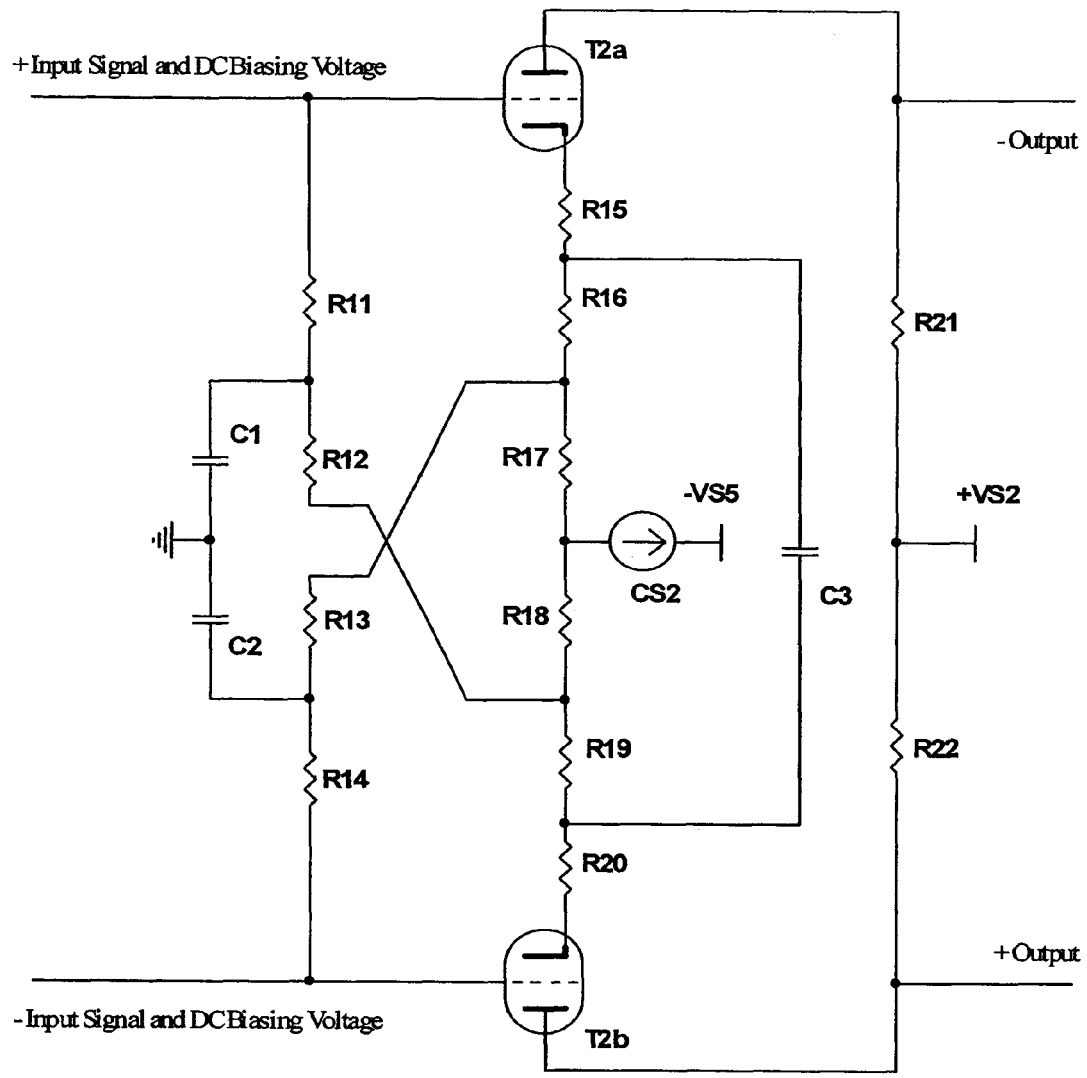
FIG. 1 is a detailed circuit arrangement of a differential amplifier with DC self-biasing according to a first preferred embodiment of the present invention.
Figure 7:
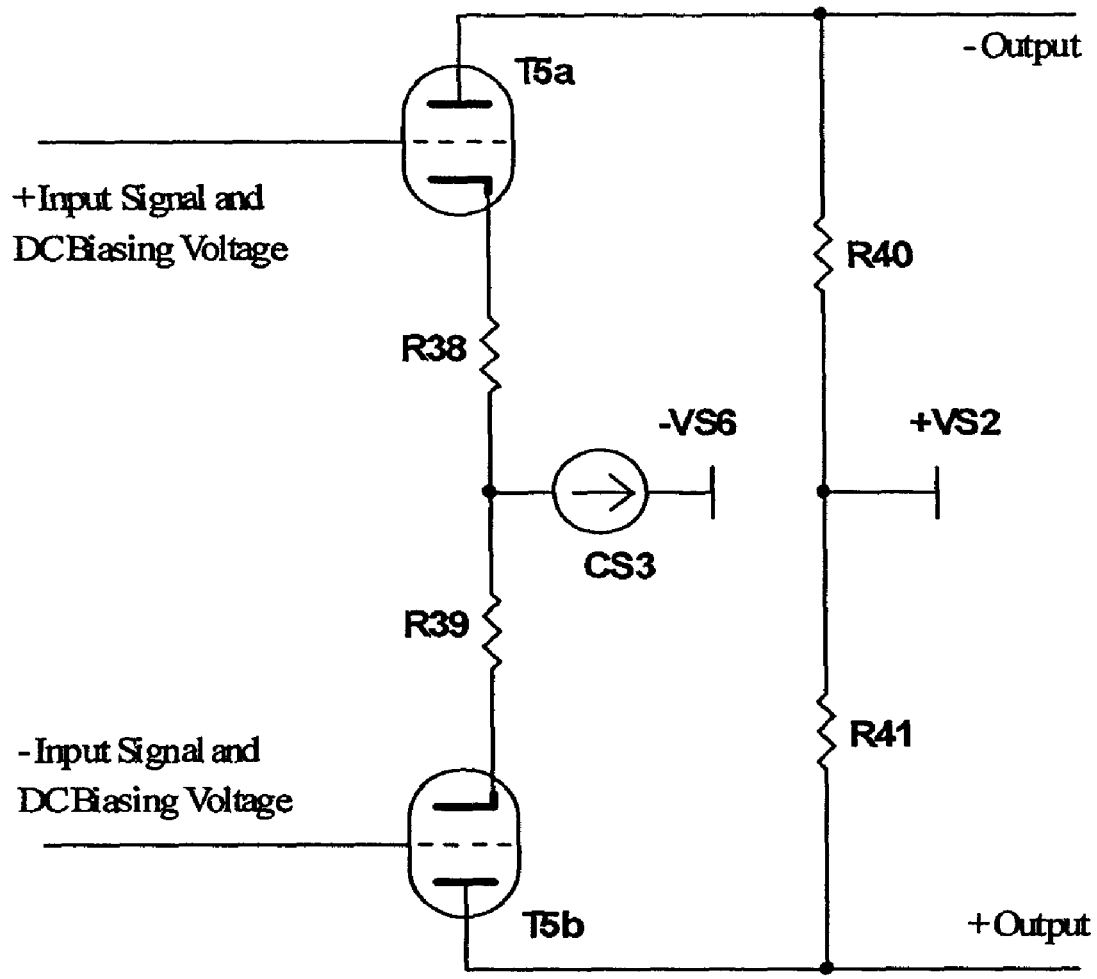
FIG. 7 is a detailed circuit arrangement of a conventional differential amplifier.

As shown in FIG. 1, a first preferred embodiment of a differential amplifier according to the present invention is realized in the form of a single-stage amplifier containing one pair of vacuum tube triodes T2a and T2b. The vacuum tubes T2a, T2b can be any of the commonly used small signal dual triodes, such as 12AT7, 12AU7, 12AX7, 6922, 6DJ8, 6SN7, 6SL7, 6H30P and the like. We assume that the inputs of this differential amplifier are directly coupled to the outputs of the previous amplifying stage, which is a conventional differential amplifier of FIG. 7.

It can be seen that the triodes T2a and T2b amplify two input signals (+Input, −Input) and generate two output signals (+Output, −Output). The output signals are taken from the plates of the vacuum tube triodes T2a, T2b. The input signals are fed to the grids of the triodes T2a, T2b, and a pair of two series resistors R11-R12, R13-R14 are cross-connected to two separate junctions formed by a pair of two series resistors R16-R17, R18-R19 respectively, such that the pairs of series resistors R16-R17, R18-R19 are connected together with a constant current source CS2 connected to a negative power supply −VS5. The constant current source CS2 may be a junction gate field-effect transistor (JFET), a metal-oxide-semiconductor field-effect transistor (MOSFET), a bipolar junction transistor (BJT), a vacuum tube triode, a pentode with complementary diodes, zener diodes and resistors, or a resistor.

Capacitors C1, C2 are connected to ground at the junctions between the two series grid resistors R11-R12, R13-R14 on each grid. The pair of series resistors R16-R17, R18-R19 are connected to the cathodes of the triodes T2a and T2b via a separate cathode series resistors, R15, R20. A capacitor C3 is connected to the junctions formed between the cathode series resistors R15, R20 and the pair of two series resistors R16-R17, R18-R19. This circuit arrangement also includes a pair of plate resistors R21, R22, connected to a positive power supply +VS2.

It is clear that the grids of the vacuum tube T2a and T2b carry both input signals and DC biasing voltages passed from the previous amplifying stage. Hence, we should examine the amplifier from two different aspects: (i) small signal point of view and, (ii) DC biasing point of view.

From the small signal point of view, the operation of the differential amplifier of FIG. 1 is given as follows. Capacitors C1 and C2 (around 0.1 µF or higher) bypass any signal that may cross-feed from grid to cathode or cathode to grid from one tube to another tube. In small signal point of view, the junctions between R11 and R12, and between R13 and R14 are shorted to ground by the capacitors C1 and C2. And if resistor value in the order of 1 MΩ or higher is chosen for R11, R12, R13 and R14, they have insignificant effect to the amplifier in terms of small signal voltage gain and frequency response.

On the other hand, capacitor C3 (around 20 µF or higher) bypasses the resistors R16, R17, R18 and R19. Therefore, in small signal point of view the resistors R16, R17, R18 and R19 are shorted together. Only resistors R15 and R20 remain to function as degenerated resistors as usual. Hence, in the small signal point of view, the differential amplifier of FIG. 1 functions identically to the conventional one in FIG. 7 with the same small signal voltage gain and frequency response.

On the other hand, and from the DC point of view, the operation of the differential amplifier of FIG. 1 is given as follows. First of all, it should be noted that when a triode is correctly biased and operates in a steady state, the DC biasing voltage at the cathode is always higher than the DC biasing voltage at the grid. In addition, no grid current flows from grid to cathode. Only DC current flows from the plate to cathode.

We assume that the two triodes T2a and T2b are well-matched tubes and the DC biasing voltages passing from the previous stage are also identical. Let us denote the DC potential difference between cathode and grid by $V_{CG}$, where $V_{CG} > 0V$. Let us also denote the DC biasing current from plate to cathode by $I_p$. In order to minimize mismatch of DC biasing when non-matched triodes T2a and T2b are used, it is best to choose the values for the resistors R15-R20 such that, $$R15=R20; R16=R19; R17=R18 \quad \text{(Eq-1)}$$

$$R15+R16=R17 \quad \text{(Eq-2)}$$

$$R19+R20=R18 \quad \text{(Eq-3)}$$

$$V_{CG}=I_p \cdot (R15+R16)=I_p \cdot R17=I_p \cdot R18=I_p \cdot (R19+R20) \quad \text{(Eq-4)}$$

where R15 and R20 are the desired degenerated resistors that determine the small signal gain of the differential amplifier.

For instance, if $V_{CG}$=5.5V and $I_p$=6 mA are chosen as the operating DC biasing values for triodes T2a and T2b, then the value for R17 and R18 can be easily found as 917Ω, or 910Ω, which is the closest practical resistor value. If 100Ω is chosen as the degenerated resistance for R15 and R20, then it can be easily found that R16 and R19 is 810Ω, or 820Ω, which is the closest practical resistor value. If the resistors are chosen on the basis of equations Eq-1 to Eq-4, it can be seen in the following that the differential amplifier will have the DC self-biasing ability that minimizes the mismatch due to the triodes T2a and T2b, and the mismatch due to the DC biasing voltages passed from the previous stage.

We assume now that the two triodes and the DC biasing voltages passed from the previous stage are poorly matched. In such a scenario, when the differential amplifier is powered up, let us denote the DC potential voltages at the grid and the cathode of the tube T2a by $V_{Ga}$ and $V_{Ca}$, respectively. Similarly, $V_{Gb}$ and $V_{Cb}$ denote, respectively, the DC potential voltages at the grid and cathode of the tube T2b. If the tube T2a operates at a higher DC biasing point such that $V_{Ga} > V_{Gb}$ and $V_{Ca} > V_{Cb}$, i.e., both grid and cathode DC potential voltages of the tube T2a are greater than tube T2b, the series resistors R11-R12 will pass along the higher potential $V_{Ga}$ and lift up the DC potential at the junction between resistors R18 and R19. As a result, the cathode DC potential ($V_{Cb}$) of tube T2b is increased and hence the grid DC potential ($V_{Gb}$) is also increased. By the same token, the series resistors R13-R14 will pass along the lower potential $V_{Gb}$ and bring down the DC potential at the junction between resistors R16 and R17. As a result, the cathode DC potential ($V_{Ca}$) of tube T2a is lowered and hence the grid DC potential ($V_{Ga}$) is also lowered. Since $V_{Cb}$ and $V_{Gb}$ are increased while $V_{Ca}$ and $V_{Ga}$ are lowered, $V_{Cb}$ and $V_{Ca}$ are pulling closer together and so are the $V_{Gb}$ and $V_{Ga}$. Eventually, the differential amplifier of FIG. 1 will rest on a closer DC biasing point than the one in FIG. 7.

Figure 2:
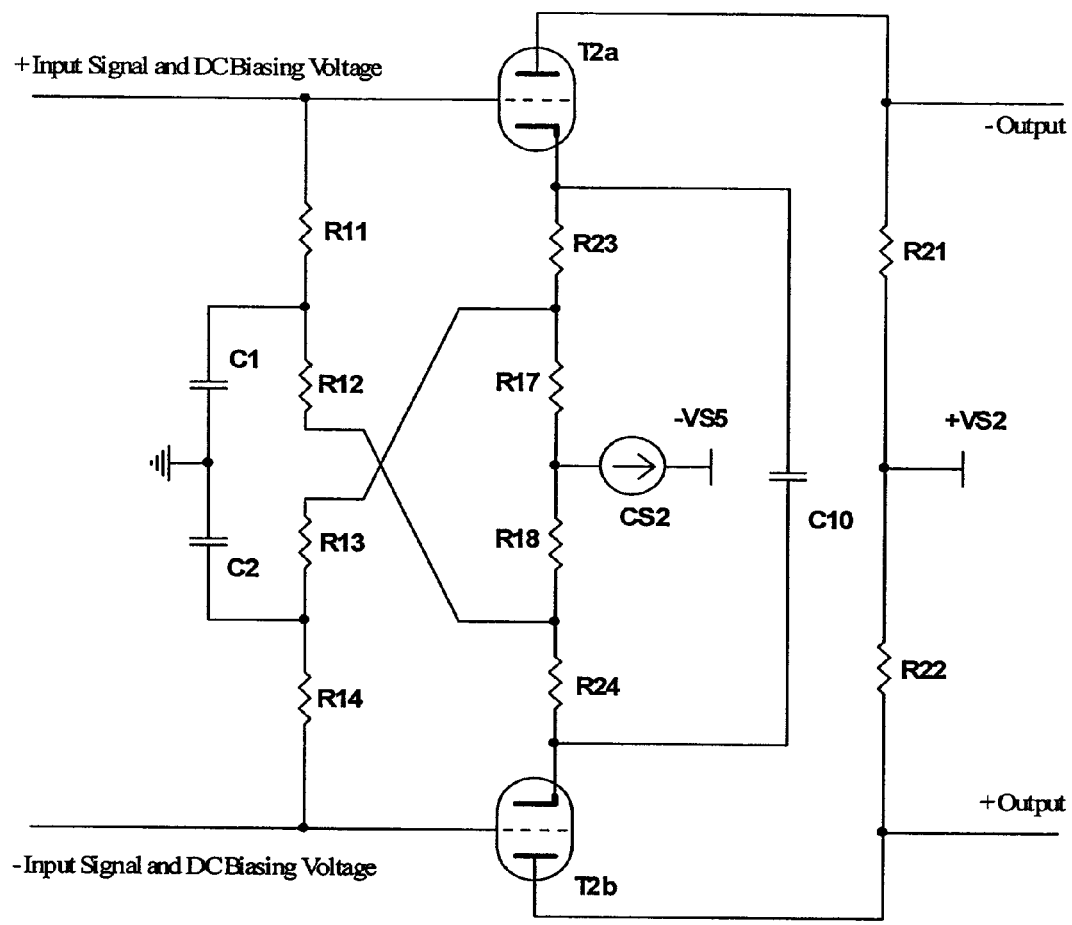
FIG. 2 is a detailed circuit arrangement of a simplified differential amplifier with DC self-biasing but without degenerated resistors according to a second preferred embodiment of the present invention.

FIG. 2 reveals a simplified version of FIG. 1 with no degenerated resistors (i.e. R15 and R20 shown in FIG. 1). Since degenerated resistors are not used, the small signal gain of the differential amplifier of FIG. 2 is higher than the one in FIG. 1. For best result, the resistors are chosen such that R23=R24=R17=R18. However, without using degenerated resistors to provide local feedback, the amplifier will have higher distortion and lower bandwidth than the one in FIG. 1.

Figure 3:
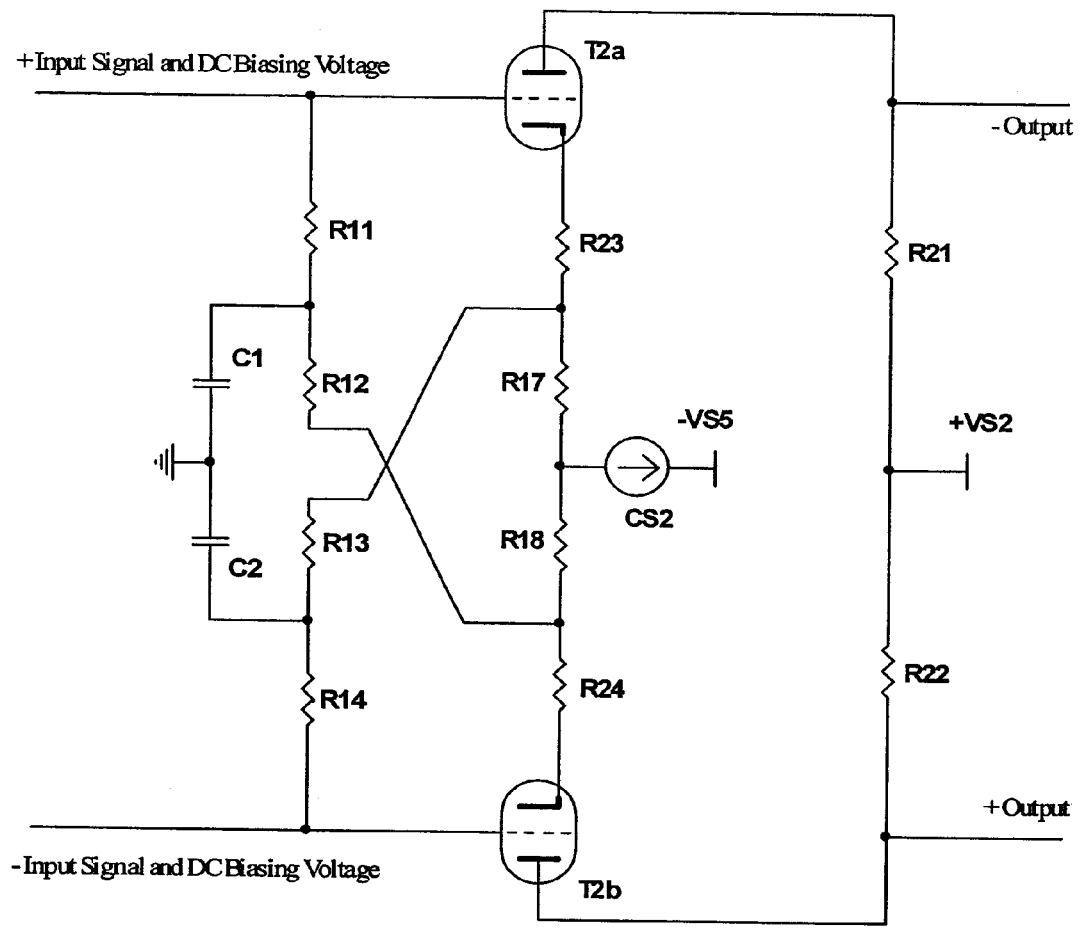
FIG. 3 is a detailed circuit arrangement of a simplified differential amplifier with DC self-biasing, with degenerated resistors but without bypassing capacitor, according to a third preferred embodiment of the present invention.

FIG. 3 shows an alternative circuit arrangement with no bypass capacitor (i.e. C3 in FIG. 1 and C10 in FIG. 2). As no bypass capacitor is used in this arrangement, the resistors R17, R18, R23 and R24 function as degenerated resistors to provide local feedback. Small signal gain is reduced but distortion and bandwidth are improved. For best result, the resistors are chosen such that R23=R24=R17=R18.

Figure 4:
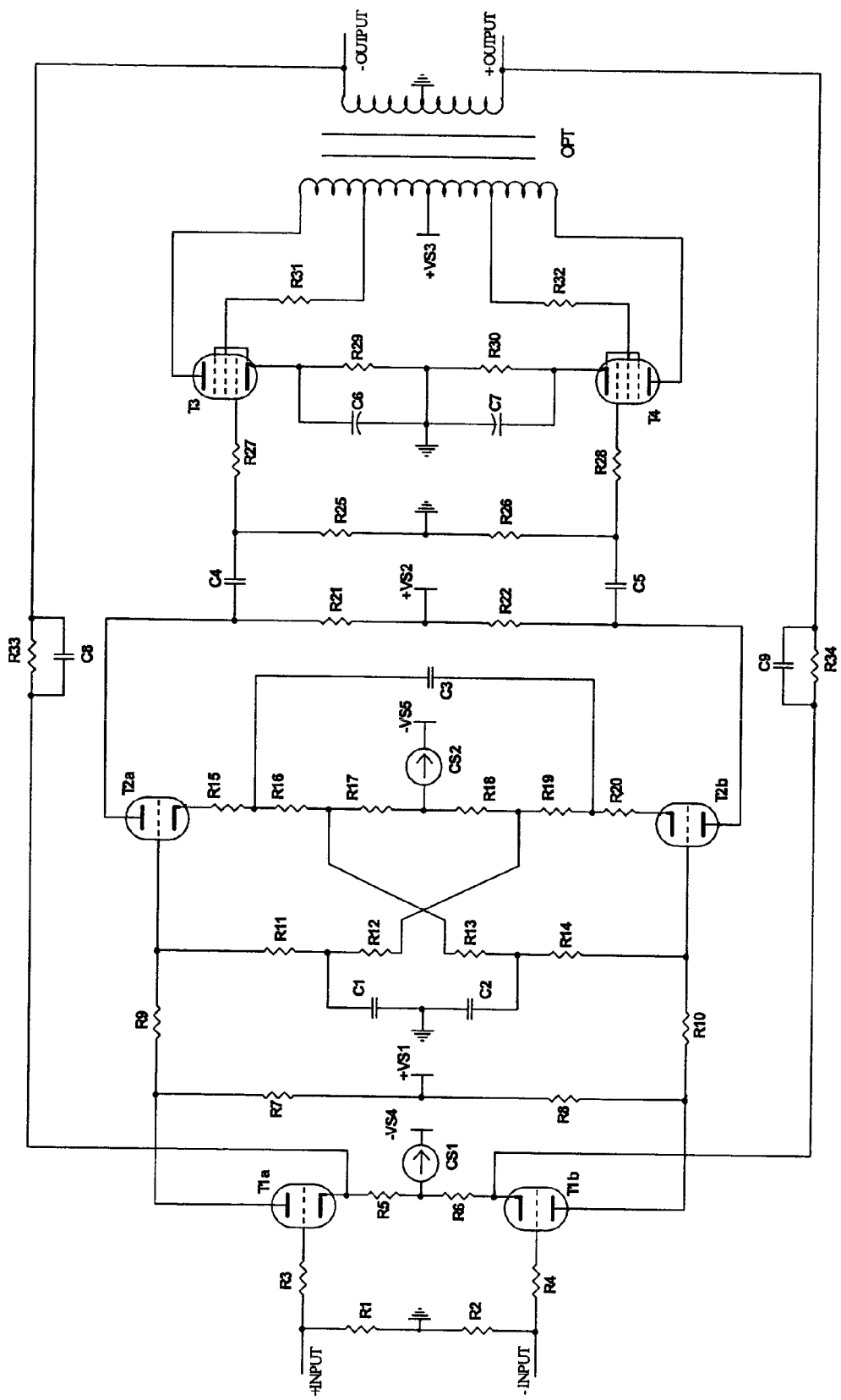
FIG. 4 is a detailed circuit arrangement of a vacuum tube balanced audio power amplifier employing the differential amplifier of FIG. 1 in the second stage.
Figure 8:
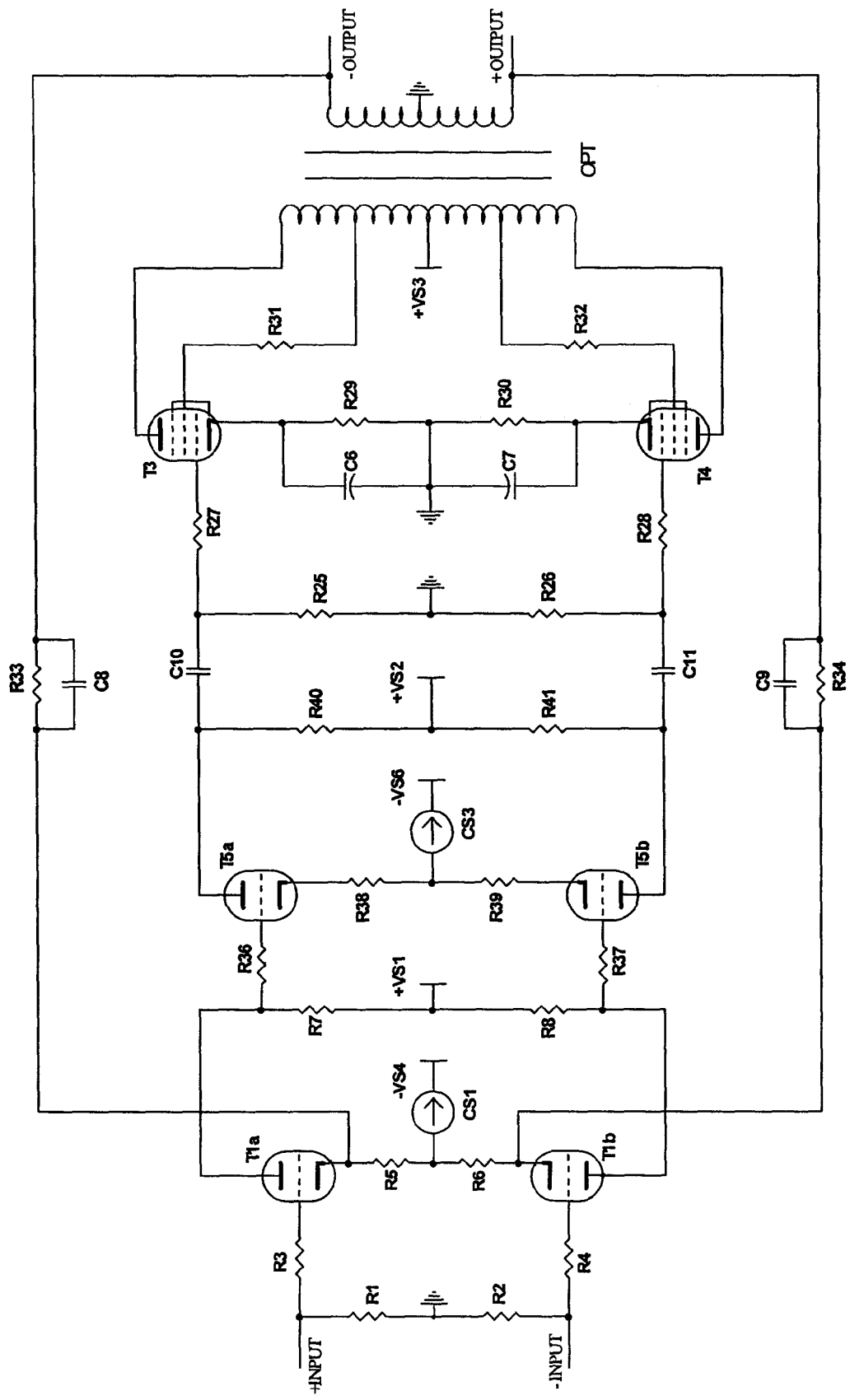
FIG. 8 is a detailed circuit arrangement of a conventional vacuum tube balanced audio power amplifier.

A vacuum tube balanced audio power amplifier employing the new DC self-biased differential amplifier is illustrated in FIG. 4. Even without the use of matched vacuum tubes for T1a and T1b, T2a and T2b, the differential amplifier in the second stage, which has the DC self-biasing ability as described above, will bring the DC biasing point to a closer level compared with the conventional differential amplifier shown in FIG. 8. However, there is one scenario in which the vacuum tubes of the differential amplifier in the second stage (i.e., T2a and T2b of FIG. 4 or T5a and T5b of FIG. 8) will be damaged.

Let us assume that in FIG. 4, T1a and T1b, T2a and T2b are vacuum tubes of different types so that T2a and T2b warm up faster than T1a and T1b. When the power amplifier is switched on, all tubes are in cold condition, and therefore they will not draw any plate current. Since there is no voltage drop across the plate resistors R7 and R8, the DC potential at the grid of T2a and T2b is equal to the supply voltage +VS1. Also, the cathode of T2a and T2b sit at the supply voltage −VS5. Therefore, the grid of T2a is at the DC potential of +VS1−(−VS5) above the cathode. It should be noted that at the steady state, the grid potential should be below the cathode potential. But in this cold condition, the polarity is in the opposite. For example, if VS1=400V and VS5=100V are chosen as the supply voltages, the DC potential of grid-to-cathode when the amplifier is switched on is 500V. If vacuum tubes T2a and T2b get warmed up and start to operate faster than the vacuum tubes T1a and T1b, the 500V grid-to-cathode voltage will force grid current to flow and easily damage the tube instantly. Therefore, there is a need to install a protection circuit so as to prevent a large grid-to-cathode voltage from building up when switching on. A power amplifier, which contains the protection circuit, is shown in FIG. 5.

Figure 5:
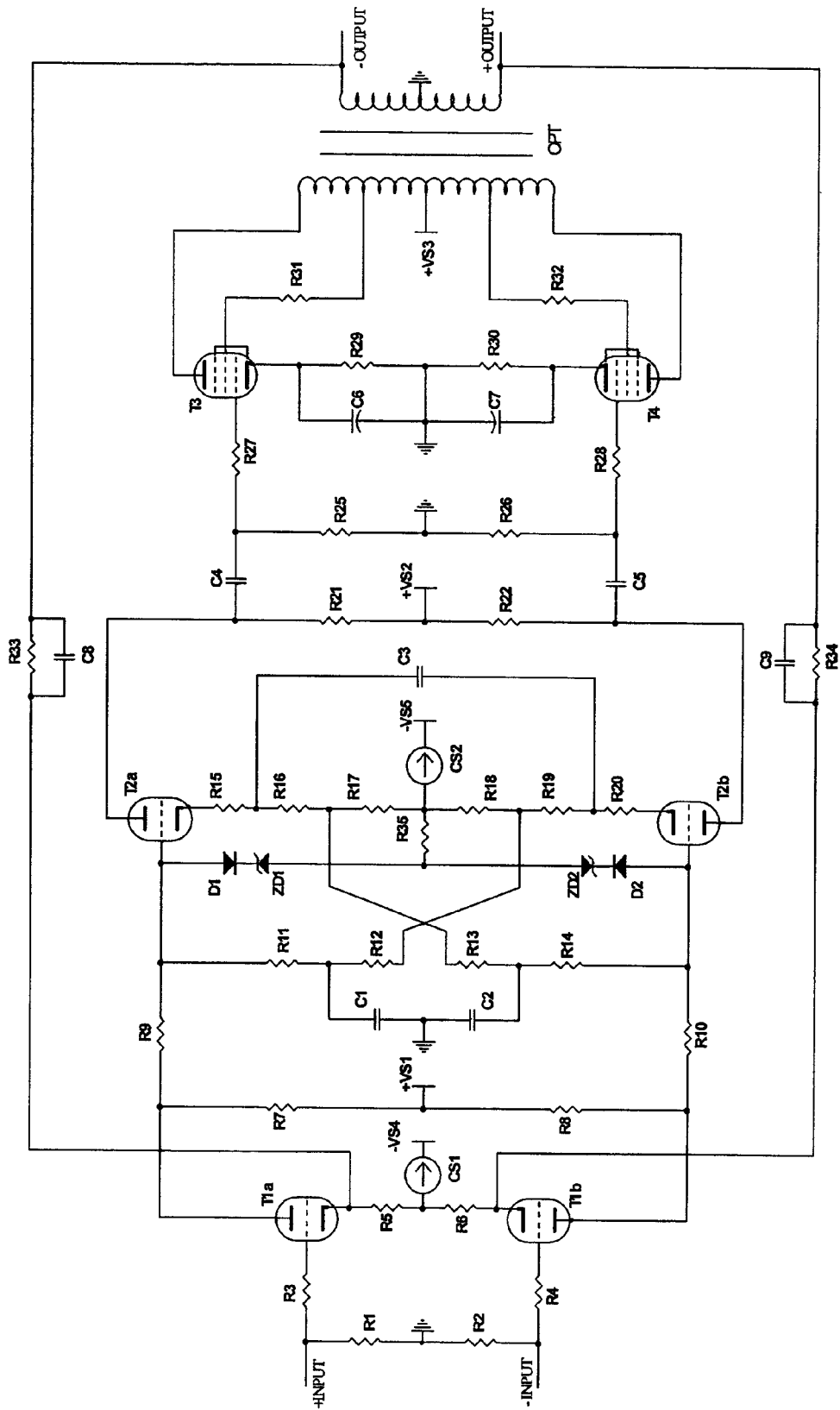
FIG. 5 is a detailed circuit arrangement of a vacuum tube balanced audio power amplifier based on the arrangement of FIG. 4, with the grid-to-cathode over-voltage protection circuit formed by diodes D1-D2 and zener diodes ZD1-ZD2.

It can be seen from FIG. 5 that the protection circuit consists of diodes D1-D2, zener diodes ZD1-ZD2 and resistor R35. The grids of the vacuum tube triodes T2a, T2b are connected to the anode of a respective diode D1, D2, which is respectively connected to the cathode of a zener diode ZD1, ZD2. The anodes of the zener diodes ZD1, ZD2 are connected with each other, and the resistor R35 is connected to the junction between the anodes of the two zener diodes ZD1, ZD2 and a constant current source CS2 which is connected to a negative power supply −VS5.

The principle of operation of the protection circuit is given as follows. When the power amplifier of FIG. 5 is switched on, as the vacuum tubes are in cold condition, there is no plate current flow. However, a small current starts to flow immediately from power supply terminal +VS1 through R7, R9, D1, ZD1 and R35 to power supply terminal −VS5 via current source CS2. The grid-to-cathode voltage difference at vacuum tube T2a is now clamped at one diode voltage plus one zener voltage that is much lower than the +500V potential difference. Similarly, a small current also starts to flow immediately from power supply terminal +VS1 through R8, R10, D2, DZ2 and R35 to power supply terminal −VS5 via current source CS2. Again, the grid-to-cathode voltage difference at vacuum tube T2b is clamped at one diode voltage plus one zener voltage. Therefore, the circuit effectively protects the tubes by avoiding a large grid-to-cathode voltage to build up when switching on.

When the tubes get warmed up and start to operate, plate currents begin to flow. If the zener diode is properly chosen, the diode and zener will be eventually turned off. In order to ensure that the diode and zener diode work properly, we should choose the diode and zener such that:

Diode forward voltage+zener reverse voltage>voltage drop of grid-to-cathode ($V_{GC}$) of vacuum tube T2a (or T2b)+ voltage drops across resistors R15, R16 and R17 (or R18, R19 and R20).

The above condition will hold true as long as there is no input signal. To prevent the diode and zener from turning on in the steady state when a signal passes through the grid, we should choose the zener reverse voltage such that:

Diode forward voltage+zener reverse voltage>voltage drop of grid-to-cathode (VGC) of vacuum tube T2a (or T2b)+voltage drops across resistors R15, R16 and R17 (or R18, R19 and R20)+maximum signal's voltage swing at the grid of the vacuum tube T2a (or T2b).

For instance, if we follow the above same example, we have the following:

a) $V_{GC} = -V_{CG} = -5.5V$;

$$\text{Voltage drops across resistors} = I_p \cdot (R15 + R16 + R17)$$
$$= 6 \text{ mA} \cdot (100\Omega + 820\Omega + 910\Omega)$$
$$= 10.98 \text{ V}$$
b)

Let us assume that the maximum signal voltage swing at the grid of the vacuum tube=5V.

If we take 0.7V as the diode forward voltage, the zener diode reverse voltage is found to be 9.78V or higher. R35 is a small value resistor that can be ignored in the above calculation. If we choose a 15V zener diode for the above application, the amplifier works in the desired manner such that the zener diodes are turned on to protect the vacuum tubes when the vacuum tubes are in cold condition. The zener diodes are then turned off during the steady state, when the vacuum tubes are in normal operation, and they do not affect the signals being amplified.

Figure 6:
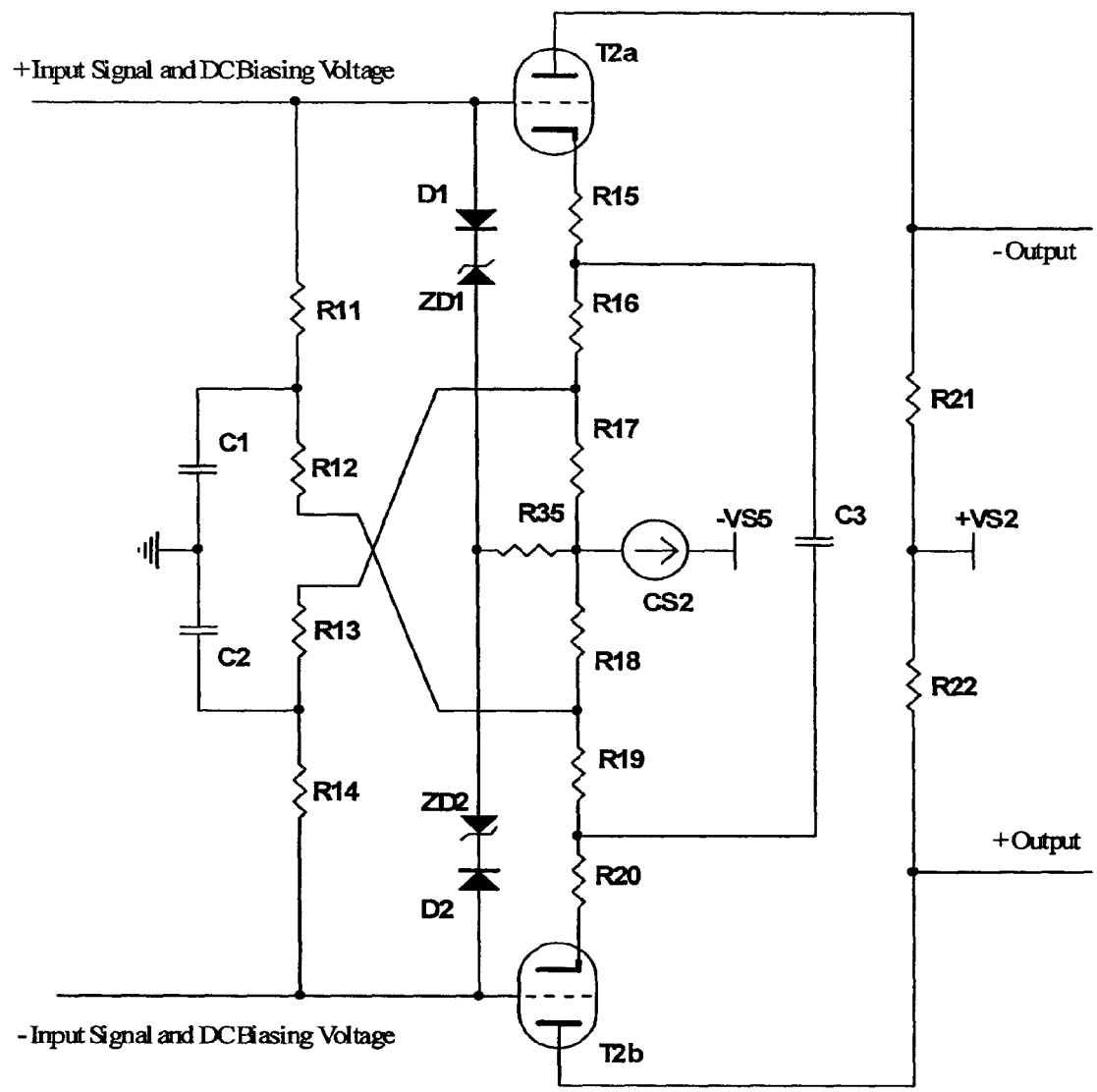
FIG. 6 is a detailed circuit arrangement of the new differential amplifier with DC self-biasing and grid-to-cathode over-voltage protection.

FIG. 6 shows the complete differential amplifier that has the DC self-biasing ability and grid-to-cathode over-voltage protection.

It should be understood that the above only illustrates examples whereby the present invention may be carried out, and that various modifications and/or alterations may be made thereto without departing from the spirit of the invention.

It should also be understood that certain features of the invention, which are, for clarity, described in the context of separate embodiments, may be provided in combination in a single embodiment. Conversely, various features of the invention that are, for brevity, described in the context of a single embodiment, may also be provided separately or in any appropriate sub-combinations.

The invention claimed is:

1. A single stage differential amplifier including a pair of vacuum tube triodes for amplifying two input signals and generating two output signals, wherein said input signals are fed to the grids of said pair of vacuum tube triodes, and a pair of two series resistors on each grid is cross-connected to two separate junctions formed by a pair of two series resistors, respectively, such that the latter pair of series resistors are connected together with a constant current source connected to a negative power supply.

2. A differential amplifier according to claim 1 wherein a capacitor is connected to ground at the junction between the two series grid resistors on each grid.

3. A differential amplifier according to claim 1 or 2 wherein the latter pair of two series resistors are connected to the cathode of the vacuum tubes via a separate cathode series resistor.

4. A differential amplifier according to claim 3 wherein a capacitor is connected to the junctions formed between the cathode series resistors and the latter pair of two series resistors.

5. A differential amplifier according to claim 4 wherein further includes a pair of plate resistors connecting to a positive power supply.

6. A differential amplifier according to claim 5 wherein the outputs are taken from the plates of the vacuum tube triodes.

7. A differential amplifier according to claim 1 wherein the constant current source comprises a JFET, MOSFET, BJT, a vacuum tube triode, a pentode with complementary diodes, zener diodes and resistors, or a resistor.

8. A differential amplifier according to claim 7 wherein the grid of the triode is connected to the anode of a diode which is connected to the cathode of a zener diode.

9. A differential amplifier according to claim 8 wherein the anode of said zener diode is connected to the anode of another zener diode that is connected to the cathode of a diode connecting to the grid of the second triode.

10. A differential amplifier according to claim 9 wherein a resistor is connected to the junction between the anodes of the two zener diodes and the constant current source which is connecting to a negative power supply.

11. A differential amplifier according to claim 2 wherein the latter pair of two series resistors are connected to the cathode of the vacuum tubes via a separate cathode series resistor.

12. A differential amplifier according to claim 11 wherein a capacitor is connected to the junctions formed between the cathode series resistors and the latter pair of two series resistors.

13. A differential amplifier according to claim 12 wherein further includes a pair of plate resistors connecting to a positive power supply.

14. A differential amplifier according to claim 13 wherein the outputs are taken from the plates of the vacuum tube triodes.

* * * * *